United States Patent
Takashima

(10) Patent No.: US 11,680,966 B2
(45) Date of Patent: Jun. 20, 2023

(54) POWER CALCULATION APPARATUS

(71) Applicant: OKUMA Corporation, Aichi (JP)

(72) Inventor: Shunichi Takashima, Aichi (JP)

(73) Assignee: OKUMA CORPORATION, Aichi (JP)

( * ) Notice: Subject to any disclaimer, the term of this patent is extended or adjusted under 35 U.S.C. 154(b) by 287 days.

(21) Appl. No.: 16/720,179

(22) Filed: Dec. 19, 2019

(65) Prior Publication Data

US 2020/0200808 A1 Jun. 25, 2020

(30) Foreign Application Priority Data

Dec. 21, 2018 (JP) .............................. JP2018-239804

(51) Int. Cl.
*G01R 21/133* (2006.01)
*H02P 23/14* (2006.01)
*H02M 5/42* (2006.01)

(52) U.S. Cl.
CPC ............ *G01R 21/133* (2013.01); *H02P 23/14* (2013.01); *H02M 5/42* (2013.01)

(58) Field of Classification Search
CPC ......... G01R 21/133; H02P 23/14; H02M 5/42
See application file for complete search history.

(56) References Cited

U.S. PATENT DOCUMENTS

| 2,079,004 A | * | 5/1937 | Doran | .................... B23Q 15/00 |
| | | | | 318/39 |
| 2010/0117568 A1 | * | 5/2010 | Iwashita | ................. H02P 21/14 |
| | | | | 318/400.02 |
| 2017/0260028 A1 | * | 9/2017 | Verheyen | ................ B66C 13/16 |
| 2017/0324246 A1 | * | 11/2017 | Sato | ........................ H02J 3/381 |

FOREIGN PATENT DOCUMENTS

| JP | 2012195985 A | * | 10/2012 |
| JP | 2012195985 A | | 10/2012 |
| JP | 2014120108 A | | 6/2014 |

OTHER PUBLICATIONS

JPO Notice of Reason for Refusal corresponding to JP Application No. 2018-239804; dated Oct. 4, 2022.

* cited by examiner

*Primary Examiner* — Natalie Huls
*Assistant Examiner* — Sharad Timilsina
(74) *Attorney, Agent, or Firm* — Cantor Colburn LLP

(57) ABSTRACT

A power calculation apparatus includes a power measurement unit configured to measure alternating-current electric power input to a converter unit to obtain measured power, power consumption estimation units configured to estimate power consumption on motor axes of corresponding motors, respectively, using parameters concerning the motors, to obtain estimated power for each motor axis, and a power consumption calculation unit configured to distribute the measured power obtained by measurement according to a ratio in accordance with the estimated power obtained by estimation to calculate power consumption for each motor axis.

2 Claims, 2 Drawing Sheets

POWER CALCULATION APPARATUS

CROSS REFERENCE TO RELATED APPLICATION

The present application claims priority under 35 U.S.C. § 119 to Japanese Patent Application No. 2018-239804 filed on Dec. 21, 2018, the entire contents of which being incorporated herein by reference.

TECHNICAL FIELD

The present disclosure relates to a power calculation apparatus for calculating power consumption of a machine tool driver section.

BACKGROUND

For machine tools configured to machine a target object by driving a motor, information concerning power consumption is required for reducing power consumption, for example. Typically, measurement devices such as a wattmeter need to be used to obtain power consumption of motors. However, a machine tool, which typically includes a great number of motor axes, would require a costly power consumption measurement system, if the system includes measurement devices in the same number as the motor axes. Therefore, various techniques for maintaining accuracy in calculating power consumption with a reduced number of measurement devices have been proposed.

JP 2012-195985 A discloses a method for determining power consumption by measuring only converter output, and calculating amplifier loss and motor loss of each motor axis and adding the calculated loss to the output calculation value of each motor axis to determine power consumption. This method calculates power consumption on each motor axis accurately with minimum costs for instruments such as a wattmeter.

SUMMARY

However, the calculation method disclosed in JP 2012-195985 A, which does not use measurement values of power in calculating the motor output, may calculate output values that are deviated from the actual output values. In addition, this calculation method, which uses measured outputs from the converter section, requires a plurality of measurement devices in the same number as the converter sections, if a plurality of converter sections are disposed.

To address the above disadvantages, an embodiment of the disclosure is directed toward providing a power calculation apparatus capable of calculating power consumption for each motor axis with a simple apparatus structure and a simple calculation method.

In one aspect of the disclosure, a power calculation apparatus calculates power consumption of a machine tool driver section. The machine tool driver section includes a converter unit configured to convert alternating-current electric power to direct-current electric power, a plurality of amplifiers configured to convert the direct-current electric power output from the converter unit to alternating-current electric power, and a plurality of motors on respective motor axes. Each motor is configured to be driven with the alternating-current electric power from a corresponding one of the amplifiers. The amplifiers and the motors are disposed for the respective motor axes. The power calculation apparatus includes a power measurement unit configured to measure alternating-current electric power input to the converter unit to obtain measured power, power consumption estimation units each configured to estimate power consumption on the corresponding one of the motor axes using parameters concerning the corresponding one of the motors to obtain estimated power for each motor axis, and a power consumption calculation unit configured to distribute the measured power obtained by measurement by the power measurement unit according to a ratio in accordance with the estimated power obtained by estimation by the power consumption estimation units to calculate the power consumption for each motor axis.

The power calculation apparatus according to the disclosure calculates power consumption for each motor axis with a simple structure and a simple calculation method.

BRIEF DESCRIPTION OF DRAWINGS

Embodiments of the present disclosure will be described based on the following figures, wherein.

DESCRIPTION OF EMBODIMENTS

Figure 1:
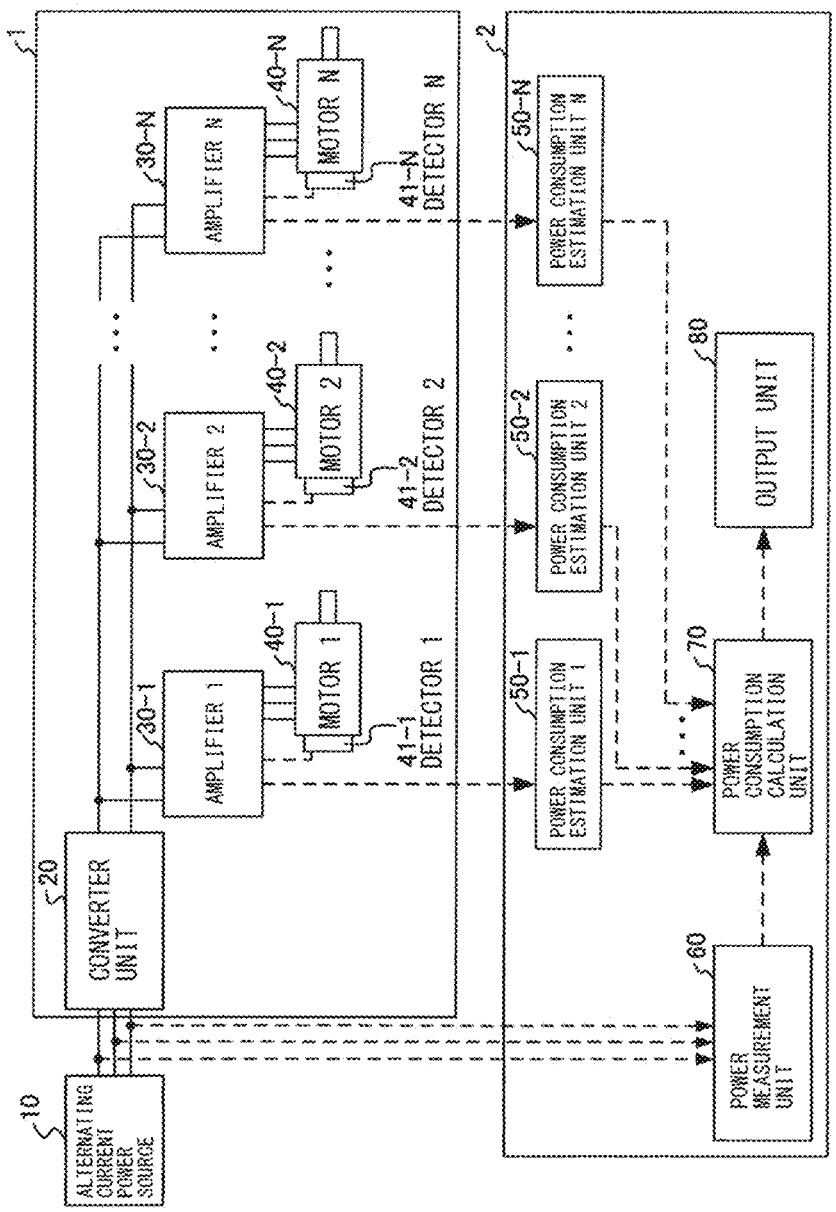
FIG. 1 illustrates a structure of a machine tool system incorporating a power calculation apparatus according to an embodiment.

A power calculation apparatus according to an embodiment will be described by reference to FIG. 1 and FIG. 2. In the drawings, solid lines indicate power supply routes, and dashed line arrows indicate signal transmission routes.

FIG. 1 illustrates the structure of a machine tool system which incorporates a power calculation apparatus 2 according to the embodiment. This system includes a machine tool driver section 1, and the power calculation apparatus 2, which calculates power consumption of the machine tool driver section 1.

The machine tool driver section 1 includes at least one converter unit 20, N (N≥2) servo amplifiers (hereinafter referred to simply as amplifiers 30-1 to 30-N) connected in parallel on the output side of the converter unit 20, and N motors 40-1 to 40-N. In the following description, letters immediately after hyphens (-) with reference numerals 30, 40, and 50 correspond to identification numbers for motor axes, which will hereinafter be referred to also as axis numbers.

The converter unit 20 converts alternating-current electric power supplied from an alternating current (AC) power source 10 to direct-current electric power, and supplies the direct-current electric power to the amplifiers 30-1 to 30-N, respectively.

While in the example illustrated in FIG. 1, N amplifiers 30 are connected in parallel for a single converter unit 20, various other connection configurations including the amplifier 30 and the motor 40 for each motor axis may be employed. For example, as illustrated in FIG. 2, the machine tool driver section 1 may include N converter units 20-1 to 20-N, which are connected to the amplifiers 30 in a one-to-one correspondence.

The motors 40-1 to 40-N are formed by AC servo motors, for example, and are connected to a main spindle of a machine tool. The motors 40-1 to 40-N include detectors 41-1 to 41-N, respectively, that output detection signals correlated to revolution rates.

The amplifiers 30-1 to 30-N convert the direct-current electric power from the converter section 20 to alternating-current electric power, and perform drive control for the motors 40-1 to 40-N, respectively, with the alternating-current electric power. More specifically, the amplifiers 30-1 to 30-N each generate a torque command value based on the detection signal from each of the detectors 41-1 to 41-N, to perform PWM (Pulse Width Modulation) control in accordance with the torque command value.

The power calculation apparatus 2 includes N power consumption estimation units 50-1 to 50-N, a power measurement unit 60, a power consumption calculation unit 70, and an output unit 80. These elements may be configured separately from the machine tool driver section 1 or may be configured by partially using the function of the machine tool driver section 1.

Each of the power consumption estimation units 50-1 to 50-N acquires parameters concerning the respective motor 40-1 to 40-N (e.g., the number of revolutions, torque, loss factor) from the corresponding one of the amplifiers 30-1 to 30-N, and estimates the power consumption for each motor (hereinafter referred to as "estimated power Qi"). More specifically, the power consumption estimation unit 50-$i$ ($i$=1, 2, ..., N) obtains the estimated power Qi for the axis number "i" according to the following equation (1):

$$Qi = Ti \cdot (2\pi Ni/60) \eta i \quad (1)$$

In the above equation, Ni is the number of revolutions of the motor 40-$i$ (unit: rpm), which is detected by the detector 41-$i$. Ti is a torque of the motor 40-$i$ (unit: N·m), which is a command value obtained by the amplifier 30-$i$, and $\eta i$ is a loss factor of the motor 40-$i$ (no unit), which is a specific value stored in a memory which is not shown.

The power measurement unit 60 measures power between the alternating current power source 10 and the converter unit 20 (hereinafter referred to as measured power P). The measured power P corresponds to effective electric power (product of voltage, current, and power factor) that is consumed in the machine tool driver section 1 when the motors are driven.

The power consumption calculation unit 70, based on the estimated power Qi from the power consumption estimation units 50-1 to 50-N and the measured power P from the power measurement unit 60, calculates power consumption Pn for each motor axis. More specifically, the power consumption calculation unit 70 calculates the power consumption Pi for axis number i according to the following equation (2):

$$Pi = P \cdot (Qi/\Sigma Qj) \quad (2)$$

In the above equation, $\Sigma Qj$ indicates a total sum of N estimated powers Qj ($j$=1, ..., N). In other words, the power consumption calculation unit 70 distributes the measured power P according to a ratio in accordance with the estimated power Qi.

The output unit 80 outputs the power consumption Pi calculated by the power consumption calculation unit 70 or information related to the power consumption Pi. The output unit 80 may be formed of a display or a speaker and may output not only the calculation result of the power consumption Pi but also a determination result concerning the operation state of the machine tool driver section 1.

As described above, the power calculation apparatus 2 includes the power measurement unit 60 that measures the alternating-current electric power input to the converter unit 20 to obtain the measured power P, the power consumption estimation units 50-1 to 50-N, each of which estimates the power consumption on the corresponding motor axis based on the parameters concerning corresponding one of the motors 40-1 to 40-N, to obtain the estimated power Qi for each motor axis, and the power consumption calculation unit 70 that distributes the measured power P obtained by measurements according to a ratio in accordance with the estimated power Qi for each motor axis, to thereby calculate the power consumption Pi for each motor axis.

The power consumption Pi for each motor axis, which is thus calculated by distributing the measured power P according to a ratio in accordance with the estimated power Qi, is continuously consistent with the actually measured value of the alternating-current electric power input to the converter unit 20 (that is, the measured power P). As such, the power consumption Pi for each motor axis can be calculated with a simple apparatus configuration and a simple calculation method.

Figure 2:
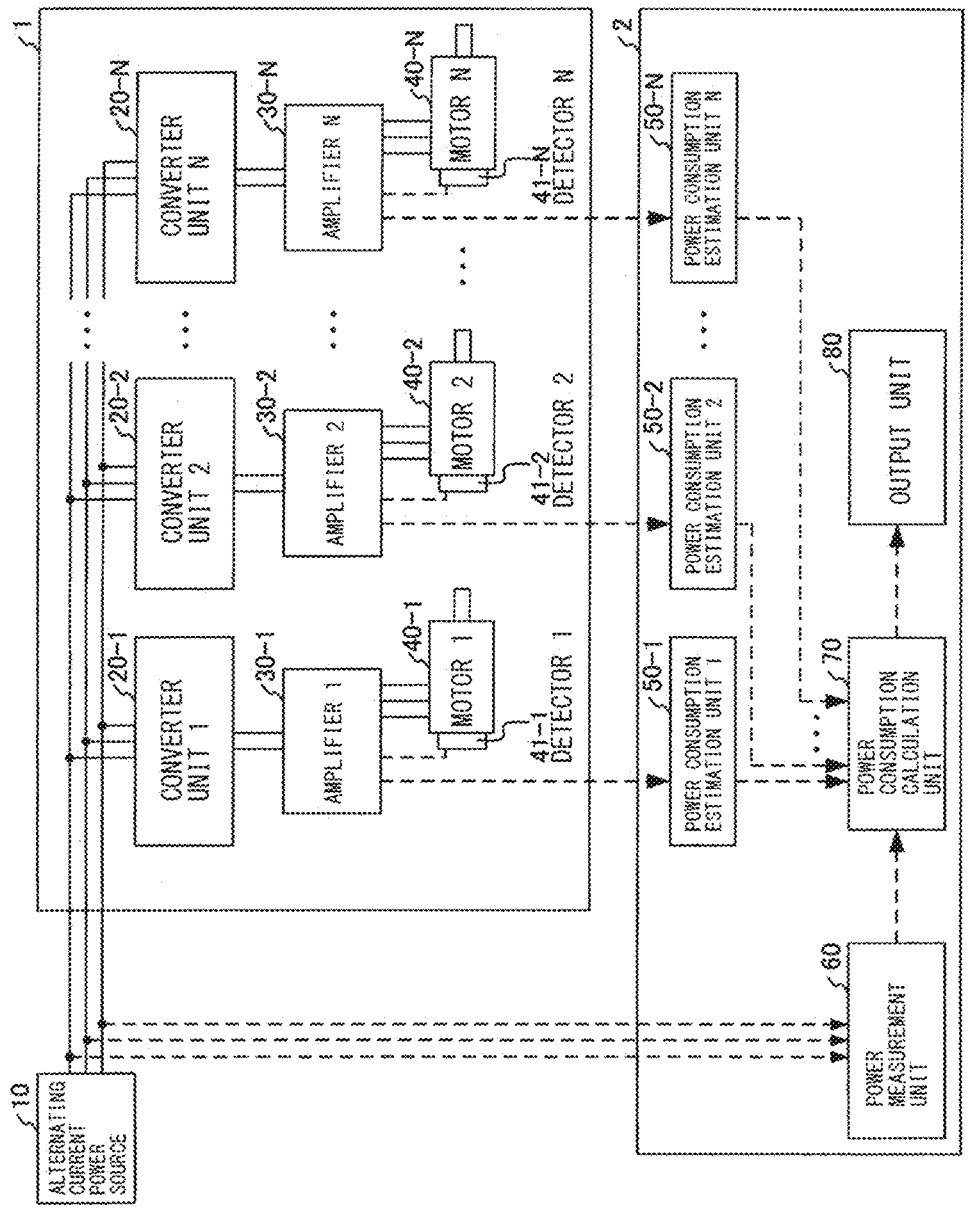
FIG. 2 illustrates another structure of the machine tool system.

In particular, when a plurality of (N in this example) converter units 20-1 to 20-N are connected in parallel with respect to a single alternating current power source 10, as illustrated in FIG. 2, only a single power measurement unit 60 is required between the alternating current power source 10 and the converter unit 20-1 in the furthest upstream position. This configuration is significantly simpler than a configuration including the power measurement units 60 on the output sides of the converter units 20-1 to 20-N in a one-to-one correspondence.

REFERENCE SIGNS LIST

1 machine tool driver section, 2 power calculation apparatus, 10 alternating current power source, 20, 20-1 to 20-N converter unit, 30, 30-1 to 30-N amplifier, 40, 40-1 to 40-N motor, 41-1 to 41-N detector, 50-1 to 50-N power consumption estimation unit, 60 power measurement unit, 70 power consumption calculation unit, 80 output unit.

The invention claimed is:

1. A power calculation apparatus for calculating power consumption of a machine tool driver section,
    the machine tool driver section, comprising:
        a converter unit configured to convert alternating-current electric power to direct-current electric power;
        a plurality of amplifiers configured to convert the direct-current electric power output from the converter unit to alternating-current electric power; and
        a plurality of motors on respective motor axes, each motor being configured to be driven with the alternating-current electric power output from a corresponding one of the amplifiers; the amplifiers and the motors being disposed for the respective motor axes,
    the power calculation apparatus comprising:
        a power measurement unit configured to measure alternating-current electric power input to the converter unit to obtain measured power;
        power consumption estimation units respectively corresponding to the motor axes in a one to one correspondence and each configured to estimate power consumption on the corresponding one of the motor axes using parameters concerning the corresponding one of the motors to obtain estimated power for each motor axis; and
        a power consumption calculation unit configured to distribute the measured power obtained by measurement by the power measurement unit according to a ratio in accordance with the estimated power obtained by estimation by the power consumption estimation units to calculate the power consumption for each motor axis, wherein a number of the power consumption estimation units being equal to a number of the motor axes, each of the power consumption estimation units estimates power consumption based on a rotational speed of a corresponding motor, a torque command value of the corresponding motor, and a predetermined loss factor of the corresponding motor, and each of the power consumption estimation units acquires parameters concerning the respective motor from the corresponding one of the amplifiers, and an i-th power consumption estimation unit obtains the estimated power for the axis number "i" according to the following equation (1):

$$Qi = Ti \cdot (2\pi Ni/60)\eta i \quad (1),$$

where Qi denotes the estimated power from an i-th estimation unit, Ni denotes a number of revolutions of an i-th motor, which is detected by an i-th detector, Ti denotes a torque of the i-th motor, which is a command value obtained by an i-th amplifier, and $\eta i$ is a loss factor of the i-th motor.

2. The power calculation apparatus according to claim 1, wherein the ratio is calculated by dividing the estimated power for a corresponding motor of the plurality of motors by a total sum of the estimated power for each of the plurality of motor, and the power consumption Pi for axis number i (i is a natural number) is calculated according to the following equation:

$$Pi = P \cdot (Qi/\Sigma Qj)$$

where P denotes the power measured by the power measurement unit, and $\Sigma Qj$ denotes the total sum of estimated powers from the power consumption estimation units.

* * * * *